United States Patent
Miura

(10) Patent No.: US 8,278,210 B2
(45) Date of Patent: Oct. 2, 2012

(54) MANUFACTURING METHOD OF SEMICONDUCTOR DEVICE

(75) Inventor: Tatsuhiko Miura, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 106 days.

(21) Appl. No.: 12/718,175

(22) Filed: Mar. 5, 2010

(65) Prior Publication Data

US 2010/0255677 A1    Oct. 7, 2010

(30) Foreign Application Priority Data

Apr. 7, 2009    (JP) .................................. 2009-092973

(51) Int. Cl.
*H01L 21/44*    (2006.01)
(52) U.S. Cl. .. 438/653; 438/584; 438/597; 257/E21.584
(58) Field of Classification Search .................. 438/584, 438/597, 652, 653; 257/E21.584
See application file for complete search history.

(56) References Cited

U.S. PATENT DOCUMENTS

| | | | | |
|---|---|---|---|---|
| 6,461,966 | B1* | 10/2002 | Chen et al. | 438/695 |
| 6,472,291 | B1* | 10/2002 | Page et al. | 438/424 |
| 6,559,026 | B1* | 5/2003 | Rossman et al. | 438/424 |
| 2002/0089027 | A1 | 7/2002 | Xu et al. | |
| 2003/0199156 | A1* | 10/2003 | Fujii | 438/597 |
| 2004/0048485 | A1* | 3/2004 | Min et al. | 438/710 |
| 2007/0148896 | A1 | 6/2007 | Nakamura et al. | |
| 2009/0246385 | A1* | 10/2009 | Felmetsger et al. | 427/301 |

FOREIGN PATENT DOCUMENTS

| | | |
|---|---|---|
| JP | 2001-127005 A | 5/2001 |
| JP | 2001-358091 A | 12/2001 |
| JP | 2004-247559 A | 9/2004 |

OTHER PUBLICATIONS

Wolf, "Silicon Processing for the VLSI Era, vol. 1", 2000, Lattice Press, pp. 461-463.*

* cited by examiner

*Primary Examiner* — Leonard Chang
(74) *Attorney, Agent, or Firm* — Mattingly & Malur, PC

(57) ABSTRACT

In a modern 0.15 μm power MOSFET, aluminum voids (voids formed in an aluminum-type electrode) are generated frequently in trench portions (source contact trenches) caused by the reduction of a cell pitch for refinement. It is considered to be attributable to the defects which are generated mainly due to a sudden increase of the aspect ratio from 0.84 in the previous generation to 2.8 in the current generation. Accordingly, concave portions of repetitive trenches having a high aspect ratio are filled with an aluminum-type metal by ionized sputtering throughout the processing, from the formation to the filling of an aluminum-type metal seed film.

8 Claims, 15 Drawing Sheets

SEM PHOTOGRAPH FOR EMBEDDED SHAPE (LARGE AREA)

SEM PHOTOGRAPH FOR EMBEDDED SHAPE (ENLARGED)

US 8,278,210 B2

MANUFACTURING METHOD OF SEMICONDUCTOR DEVICE

CROSS-REFERENCE TO RELATED APPLICATIONS

The disclosure of Japanese Patent Application No. 2009-92973 filed on Apr. 7, 2009 including the specification, drawings and abstract is incorporated herein by reference in its entirety.

BACKGROUND OF THE INVENTION

The present invention concerns a technique which is effective when applied to a technique of forming a metal electrode in a manufacturing method of a semiconductor device (or semiconductor integrated circuit device).

Japanese Patent Laid-Open No. 2004 (Hei-16)-247559 (Patent Document 1) or US Published Application No. 2007-0148896 (Patent Document 2) discloses a technique of forming a ruthenium film as a lower electrode of a DRAM (Dynamic Random Access Memory) by sputtering according to PCM (Point Cusp Magnetron) (that is, PCM sputtering) and CVD (Chemical Vapor Deposition).

Japanese Patent Laid-Open No. 2001 (Hei-13)-358091 (Patent Document 3) or US Published Application No. 2002-0089027 (Patent Document 4) discloses a technique of forming a titanium film, a titanium nitride film, etc. as a barrier metal layer by a sort of ionized sputtering for improving filling of aluminum to contact holes.

Japanese Patent Laid-Open No. 2001 (Hei-13)-127005 (Patent Document 5) discloses a technique of forming a titanium film as a barrier metal layer by sputtering according to an IMP (Ion Metal Plasma) method (that is, IMP sputtering) for burying holes of large aspect ratio with aluminum.

SUMMARY OF THE INVENTION

The present inventors have found that, in a modern 0.15 µm power MOSFET, aluminum voids (voids formed in an aluminum type electrode) are generated frequently in trench portions (source contact trenches) by the reduction of a cell pitch for refinement. It is considered to be attributable to that the defects are generated mainly due to the sudden increase of the aspect ratio from 0.84 in the previous generation to 2.8 in the current generation.

As a countermeasure, it may be considered to use a CVD tungsten type electrode instead of the sputtered aluminum electrode, but this sometimes rather results in a disadvantage from a viewpoint of shock absorbing performance, etc. in certain types of products that require high reliability.

The present invention has been accomplished in order to solve such a problem.

The invention intends to provide a manufacturing method of a semiconductor device at high reliability.

The above and other objects and novel features of the invention will become apparent from the descriptions of the present specification and accompanying drawings.

An outline for a typical invention among those disclosed in the present specification is briefly described as below.

That is, according to one invention of the present invention, concave portions of repetitive trenches having a high aspect ratio are filled with an aluminum type metal by ionized sputtering throughout the processing from the formation to the filling of an aluminum type metal seed film.

An advantageous effect obtained by a typical invention among the inventions disclosed in the present invention is to be described briefly below.

That is, when concave portions such as repetitive trenches having a high aspect ratio are filled with the aluminum type metal, since this is conducted by ionized sputtering from the formation to the filling of the aluminum type metal seed film, a sufficient filling property can be attained while ensuring good film quality.

DETAILED DESCRIPTION OF THE PREFERRED EMBODIMENTS

Outline of the Embodiments

Figure 1:
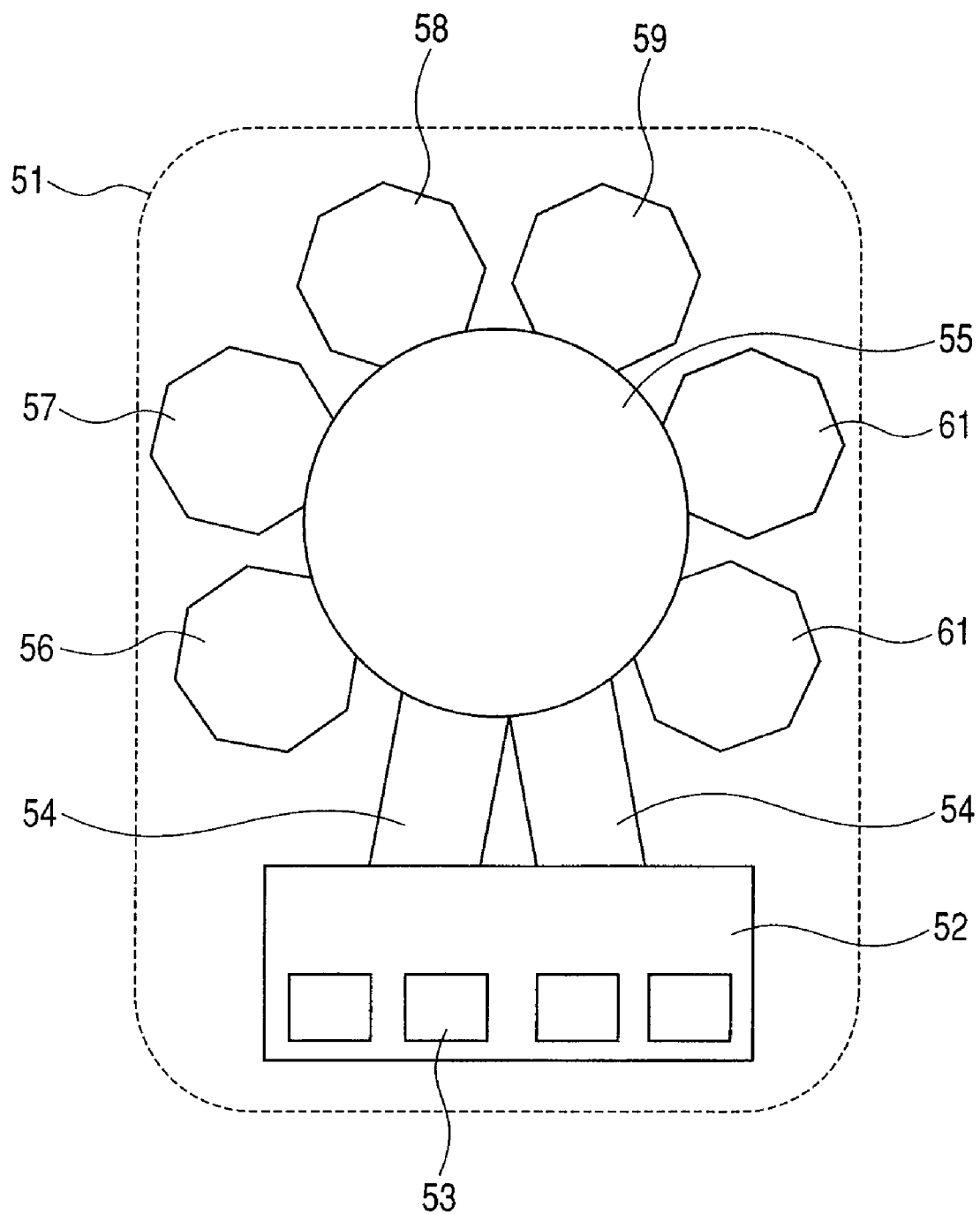
FIG. 1 is a planar configurational view of a multi-chamber type wafer processing apparatus used in a manufacturing method of a semiconductor device according to an embodiment of the present invention.

At first, typical embodiments of the invention disclosed in the present invention are to be described.

1. A manufacturing method of a semiconductor device comprises the steps of: (a) forming downward a concave portion from the upper surface of a first insulator film over the first main surface of a semiconductor wafer; (b) forming a barrier metal film to the inner surface of the concave portion and the upper surface of the first insulator film; and, (c) after the step (b), forming an aluminum type metal layer so as to fill the inside of the concave portion and cover the upper surface of the first insulator film in a sputter processing chamber by ionized sputtering.

2. In the manufacturing method of a semiconductor device according to 1 described above, the step (c) is conducted in a state of directing upward the first main surface of the semiconductor wafer on a wafer stage having an electrostatic chuck disposed in the sputter processing chamber.

3. In the manufacturing method of the semiconductor device according to 1 or 2 described above, the step (c) includes the sub-steps of: (c1) forming a seed aluminum type metal layer so as to cover the barrier metal film at the inner surface of the concave portion and at the upper surface of the first insulator film; and (c2) continuing the ionized sputtering thereby forming the aluminum type metal layer to fill the inside of the concave portion and cover the upper surface of the first insulator film being integrated with the seed aluminum type metal layer.

4. In the manufacturing method of the semiconductor device according to 3 described above, the electrostatic chuck is in an off state in the sub-step (c1) and the electrostatic chuck is in an on state in the sub-step (c2).

5. In the manufacturing method of the semiconductor device according to any one of 1 to 4 described above, the temperature of the wafer stage is 400° C. or higher and lower than 440° C.

6. In the manufacturing method of the semiconductor device according to any one of 1 to 5 described above, the sputter processing chamber is a magnetron type.

7. In the manufacturing method of the semiconductor device according to any one of 1 to 6 described above, a first high frequency power and a DC bias are applied on the side of the target in the step (c).

8. In the manufacturing method of the semiconductor device according to any one of 3 to 7 described above, a bias is applied by a second high frequency power for the electrode on the side of the wafer stage in the sub-step.

9. In the manufacturing method of the semiconductor device according to any one of 1 to 8 described above, the semiconductor device has a power MOSFET or IGBT.

10. In the manufacturing method of the semiconductor device according to any one of 1 to 9 described above, the aluminum type metal layer is the source electrode of the power MOSFET or the emitter electrode of the IGBT.

11. In the manufacturing method of the semiconductor device according to any one of 1 to 10 described above, the aspect ratio of the concave portion is 2 or more.

12. In the manufacturing method of the semiconductor device according to any one of 1 to 11 described above, the concave portion reaches as far as the inside of the substrate portion of the semiconductor wafer.

[Explanation for the Form of Description, Basic Terms, and Usage in the Present Specification]

1. In the present specification, preferred embodiments are sometimes described while being divided into a plurality of sections for the sake of convenience. However, unless otherwise specified, they are not independent of and separate from each other but they are respective portions of the embodiment, or one of them is details or a modified example for a portion or an entire portion of any other portion. Further, as a rule, duplicate explanation is to be omitted for identical portions. Further, each of constitutional factors in a preferred embodiment is not indispensable unless otherwise specified, when it is theoretically restricted to a specific number, or when it is not apparently so in view of the context.

Further, in the present specification, when described as "semiconductor device", this mainly means a single device such as various kinds of transistors (active devices), and those in which resistors, capacitors, etc. are integrated around the same, for example, over a semiconductor chip, etc. (for example, single crystal silicon substrate). Further, the single device may actually comprise sometimes fine devices integrated in plurality. Typical examples of the various kinds of transistors can include, for example, MISFET (Metal Insulator Semiconductor Field Effect Transistor) typically represented by MOSFET (Metal Oxide Semiconductor Field Effect Transistor), and IGBT (Insulated Gate Bipolar Transistor). Further, even when it is described as "MOS", the insulator film is not restricted to that of an oxide.

2. Also in the description for preferred embodiments, etc. when it is described as "X comprising A", etc. with respect to materials, compositions, etc., this does not exclude those having an element other than A as one of main constitutional factors unless otherwise specified, or it is apparently not so in view of the context. For example, referring to the ingredient, this means "X containing A as a main ingredient", etc. For example, even when it is described as "silicon material" or the like, this is not restricted to pure silicon but includes an SiGe alloy or other polynary alloys comprising silicon as the main ingredient and materials containing other additives. In the same manner, when it is described as "silicon oxide film", "silicon oxide type insulator film", or the like, it is apparent that this includes not only a relatively pure undoped silicon oxide (undoped silicon dioxide) but also thermal oxide films such as FSG (Fluorosilicate Glass), TEOS based silicon oxide, SiOC (Silicon Oxicarbide), carbon doped silicon oxide, or OSG (Organosilicate Glass), CVD oxide film, SOG (Spin On Glass), coating type silicon such as nano-clustering silica (NSC), silica type low-k insulator film (porous type insulator film) formed by introducing voids to materials similar therewith, as well as composite films with other silicon type insulator films comprising them as main constituent factors.

Further, silicon type insulator films which are customarily used along with silicon oxide type insulator films in the field of semiconductors include silicon nitride type insulator films. Materials belonging to such a group include SiN, SiCN, SiNH, SiCNH, or the like. When it is described as "silicon nitride", this includes both SiN and SiNH unless otherwise specified. In the same manner, when described as "SiCN", this includes both SiCN and SiCNH unless otherwise specified.

While SiC has a nature similar to that of SiN and SiCN, it should be classified, in most cases, rather as a silicon oxide type insulator film.

3. In the same manner, while preferred examples are shown with respect to configuration, position, and belonging, it is apparent that they are not restricted strictly thereto unless otherwise specified or they are apparently not so in view of the context.

4. Further, also when a particular numerical value or quantity is referred to, this may be a numerical value exceeding the particular value or a value less than the particular value excepting a case where it is otherwise specified, a case where the value is restricted theoretically to the particular value, or a case where it is not apparently so in view of the context.

5. When it is described as "wafer", this usually means a single crystal silicon wafer over which semiconductor devices (also semiconductor integrated circuit devices and electronic devices) are formed, but it is apparent that this also includes a composite wafer comprising an insulative substrate such as an epitaxial wafer, an SOI substrate, or an LCD glass substrate and a semiconductor layer, etc.

6. "Ionized sputtering" is a certain type of directional sputtering which can attain sputtering film deposition of good coverage by utilizing the fact that ionized metal ions, etc. are incident with a relatively large vertical velocity component to a wafer surface by a sheath voltage (additional bias may sometimes be applied further), whereas usual metal sputtering film deposition mainly relies on electrically neutral sputtered atoms, molecules, or clusters thereof. While the ionized sputtering system includes various types and is specifically described herein with respect to the PCM type, it is apparent that the ionized sputtering is not restricted to this type. Accordingly, any method in which ionized metal atoms intended for film deposition contribute substantially to the film deposition may be used irrespective of the name thereof. While the ionized sputtering apparatus has been explained specifically as an example of using a PCM type I-1080 PCM manufactured by Canon Anelva Co. as the ionized sputtering apparatus, it includes other ionized sputtering apparatus, for example, SIP-PVD (Self-Ionized Plasma Physical Vapor Deposition) apparatus manufactured by Applied Materials Co. Further, similar apparatus are also provided by Ulvac Co.

Details for Preferred Embodiment

A preferred embodiment is to be described more specifically. In each of the drawings, identical or similar portions are shown by identical or similar symbols or reference numerals for which duplicate explanations are to be omitted as a rule.

Further, in the accompanying drawings, hatchings, etc. may sometimes be omitted even for cross sections in a case where they make the matter complicated or where distinction from the space is apparent. In connection therewith, even for a hole closed in view of a plane, a contour line at the background thereof may sometimes be omitted in a case if it is apparent based on explanation, etc. Further, hatchings may sometimes be applied even for a non-cross-sectioned portion in order to clearly show that the portion is not a space.

1. Explanation for Metal Film Deposition Apparatus, Etc. Used for the Manufacturing Method of a Semiconductor Device According to a Preferred Embodiment of the Present Invention (Mainly, with Reference to FIG. 1 and FIG. 2)

At first, a metal film deposition apparatus, etc. used for a manufacturing method of a semiconductor device according to a preferred embodiment of the present invention is to be explained briefly. FIG. 1 is a planar configurational view of a multi-chamber type (cluster type) wafer processing apparatus used for the manufacturing method of the semiconductor device according to the preferred embodiment of the present invention.

As shown in FIG. 1, a sputtering apparatus used for the manufacturing process (titanium sputtering chamber 58, AlSi sputtering chamber 61, TiN reactive sputtering film deposition chamber 59), a heat processing apparatus (preheat processing chamber 56), etching apparatus (sputter etching chamber 57), etc. are integrated in a cluster apparatus 51. The cluster apparatus 51 has a load port (or pre-chamber) 52 containing four wafer cassettes 53 at a normal pressure. Wafers contained in the load port 52 are supplied from one of two load lock chambers 54 through an evacuated vacuum transportation chamber 55 to each of the processing chambers. Upon discharge, the wafers are transported in a reverse way.

This embodiment shows an example where the silicidation annealing step after titanium nitride film deposition is conducted in an external batch treatment furnace which is different from that of the multi-chamber type wafer processing apparatus 51. However, the step may also be conducted without contacting a wafer 1 with atmospheric air in a series of processes by using one of a plurality of AlSi sputtering chambers 61 as a sheet-by-sheet RTA (Rapid Thermal Annealing) chamber. Generally, the planarity of the aluminum type metal film cannot be ensured subsequently unless the surface of an upper barrier metal film 23b (TiN, TiW, etc.) is extremely clean. However, in the formation of the aluminum type metal film by the ionized sputtering method, since this is insensitive to the surface state of the underlayer film, the apparatus may also be adapted such that the wafer is in contact with the atmospheric air in the course of the process and this can provide an advantage that the degree of freedom increases in the production.

Figure 2:
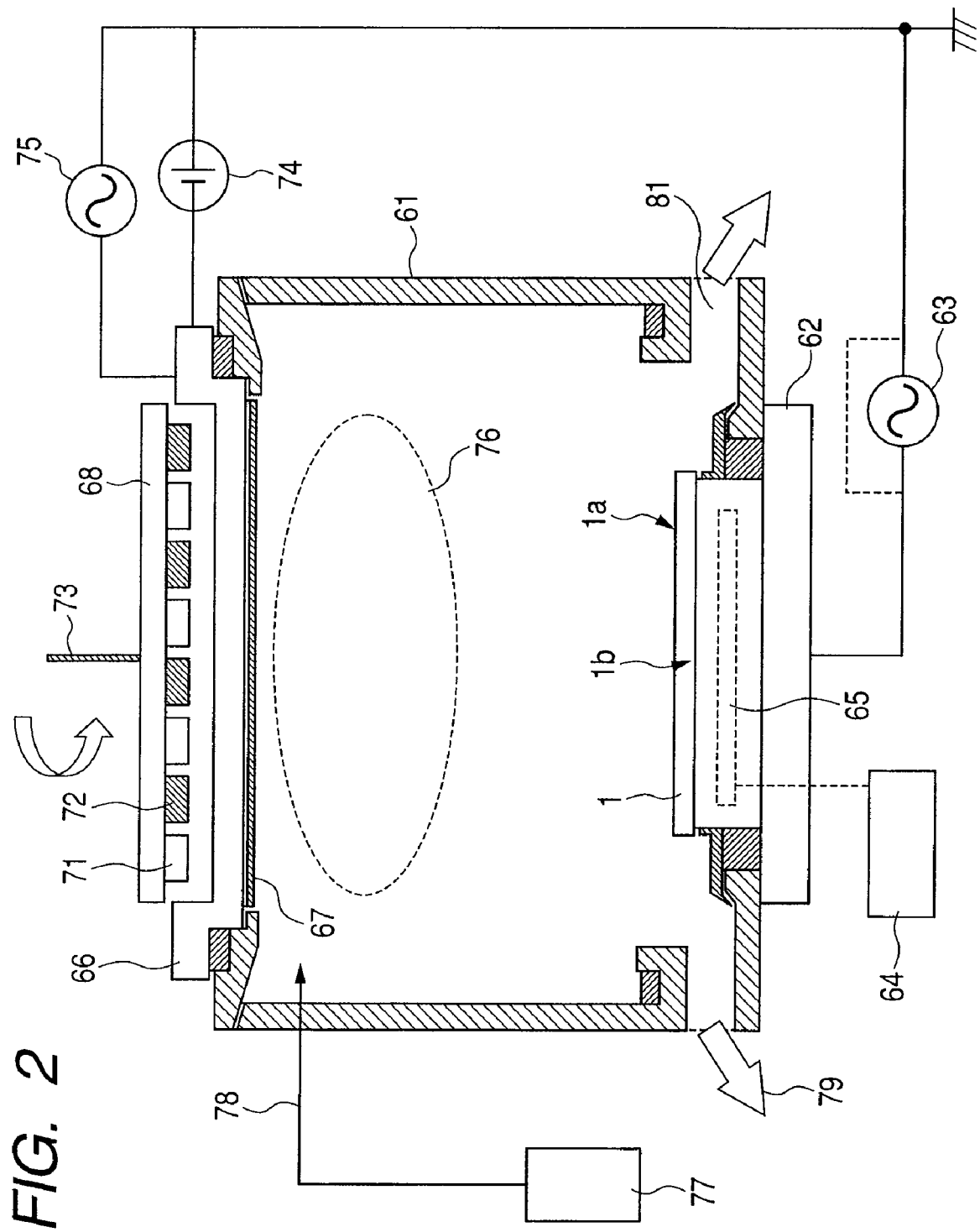
FIG. 2 is a schematic cross-sectional view of a PCM (Point Cusp Magnetron) type sputtering chamber used in the step of forming an aluminum type metal film deposition in the manufacturing method of a semiconductor device according to the embodiment of the present invention.

FIG. 2 is a schematic cross-sectional view of the PCM (Point Cusp Magnetron) type sputtering chamber 61 used for the aluminum type metal film deposition step in the manufacturing method of the semiconductor device according to the embodiment of the present invention. The sputtering chamber (sputtering apparatus) is also included in the magnetron sputtering type like other general-purpose metal sputtering apparatus. As shown in FIG. 2, a lower electrode (wafer stage) 62 is disposed in a lower portion of the chamber 61, and a wafer 1 is set during film deposition to the wafer stage 62 with a device surface 1a (surface opposite to the rear face 1b) being directed upward.

A high frequency bias (second high frequency power) can be applied to the lower electrode 62 by a lower electrode high frequency bias power source 63 (for example, at 13.56 MHz). Further, it can also be grounded directly to ground. Further, an electrostatic chuck electrode 65 is disposed in the wafer stage 62 and can be turned on and off by an electrostatic chuck control system 64.

Opposing the wafer stage 62, an upper electrode (target backing plate) 66 is disposed in the upper portion of the chamber 61, and an aluminum type target 67 (for example, an aluminum target containing about 1% silicon in this case) is set to the lower surface thereof. A DC current power (DC current bias) and a high frequency power (first high frequency power) can be applied to the upper electrode 66 from an upper electrode DC current bias power source 74 and an upper electrode high frequency power source 75 (for example, at 60 MHz)(both or one of them can be selected). This enables excitation of argon plasmas 76 and generation of a desired bias voltage. Further, a magnet holding rotary table 68 having S-poles 71 and N-poles 72 arranged alternately is disposed near the upper side of the target backing plate 66 and can be rotated by a driving shaft 73 (axis of rotation).

A gas supply control system 77 is disposed to the outside of the chamber 61, such that an argon gas or other gas can be supplied through a gas supply channel 78 to the inside of the chamber 61. Further, the inside of the chamber 61 is evacuated and exhausted by an evacuation exhaustion system 79 through an exhaustion port 81 disposed in a lower portion thereby enabling to maintain high vacuum necessary for the sputtering.

In this embodiment, the lower barrier metal film (titanium film) 23a is deposited by using a usual sputtering film deposition apparatus (not ionized sputtering type) but may also be deposited by using the sputtering film deposition apparatus of the ionized sputtering type such as a PCM type.

For the lower barrier metal film 23a (partially, metal silicide), TiW, Ta, W, WSi, etc. can be used in addition to titanium described above.

2. Explanation for an Example of a Power MOSFET Manufactured by the Manufacturing Method of the Semiconductor Device According to the Preferred Embodiment of the Present Invention (Mainly, with Reference to FIG. 3)

Figure 3:
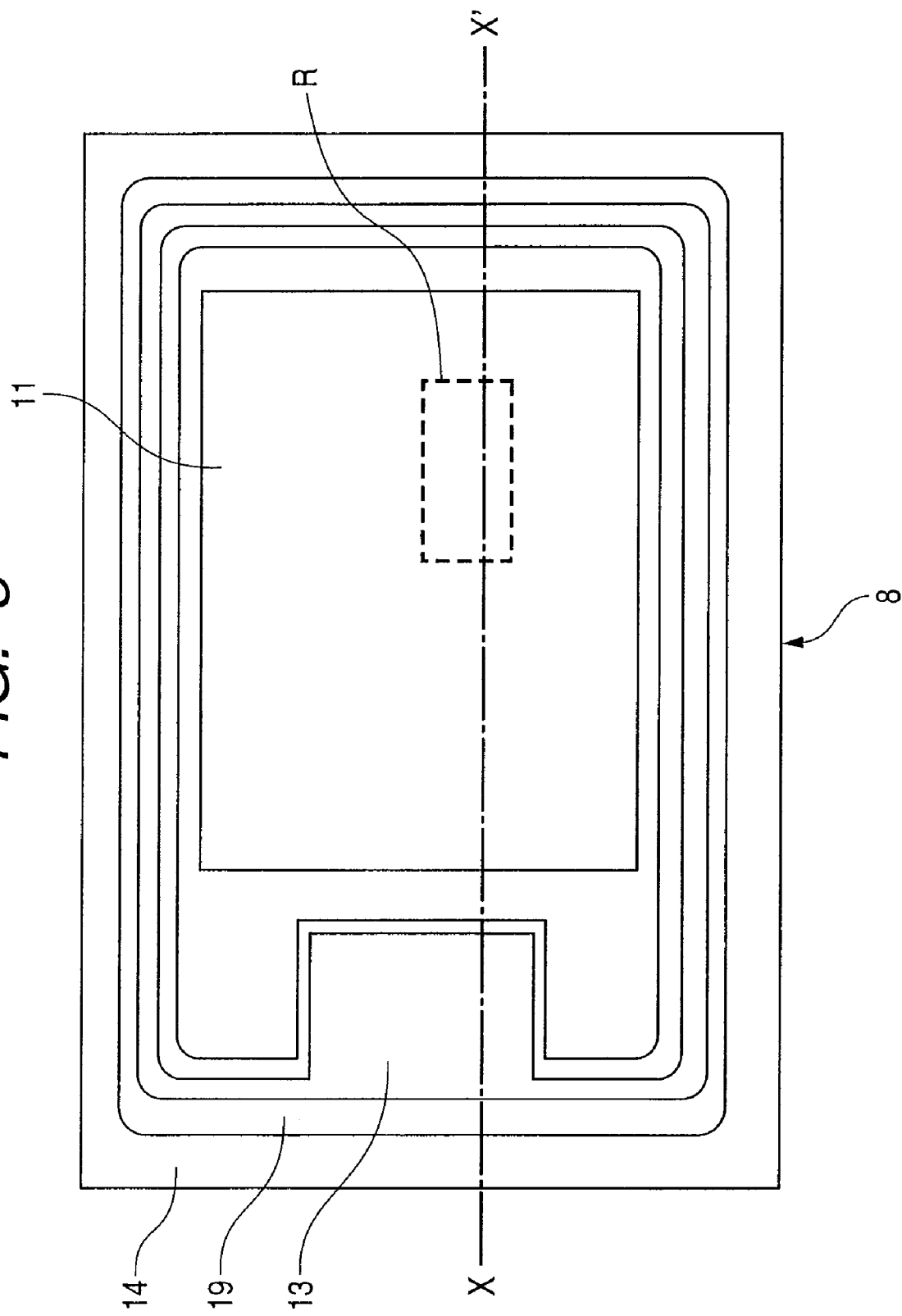
FIG. 3 is an upper plan view of a device showing an example of a power MOSFET manufactured by the manufacturing method of the semiconductor device according to the embodiment of the present invention.

FIG. 3 is an upper plan view for a device showing an example of a power MOSFET manufactured by the manufacturing method of the semiconductor device according to the preferred embodiment of the present invention. As shown in FIG. 3, in a power MOSFET device chip 8 (trench gate power MOSFET semiconductor device) in which a device is formed over a square or rectangular plate shaped silicon type semiconductor substrate (wafer before dicing into individual chips), a source pad region 11 (aluminum type pad) at the central portion occupies a main area. Below the region 11, there is present a repetitive strip device pattern region R (linear cell region) where a plurality of strip gate electrodes (corresponding to columnar trench gate electrodes) and strip source contact regions extending sufficiently longer than the width (or pitch) thereof are alternately formed in plurality. More accurately, the linear cell region R extends substantially entirely below the source pad region 11, and a portion surrounded by a broken line is a portion thereof. A gate pad region 13 is present at the periphery of the linear cell region R for externally leading out the gate electrode from the periphery. An aluminum guard ring 19 is provided further therearound. Then, the outermost peripheral portion of the chip 8 is a region used for dividing the wafer by dicing or the like, that is, a scribe region 14.

3. Explanation for the Outline of the Process Flow for a Device Cross Section Related to the Manufacturing Method of the Semiconductor Device According to the Preferred Embodiment of the Present invention (mainly with reference to FIG. 4 to FIG. 11, FIG. 1 and FIG. 2)

In this section, a process flow is to be described for a linear trench gate type power MOSFET of 0.15 μm process as an example based on FIG. 4 to FIG. 11, for a device cross section corresponding to the cutout portion of the repetitive strip device pattern region (linear cell region) R shown in FIG. 3 described in the section 2.

Figure 4:
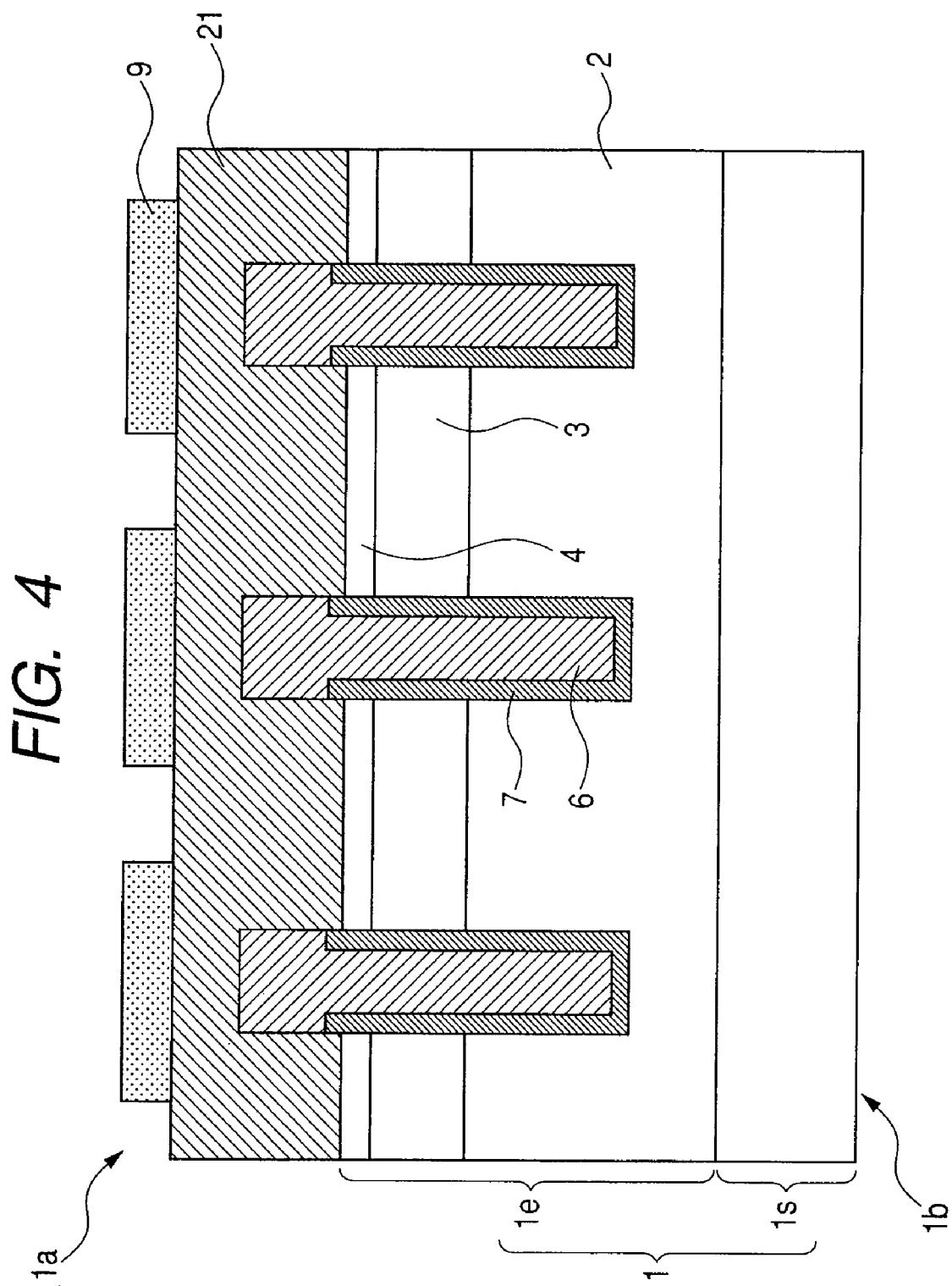
FIG. 4 is a flow view for the device cross section in a trench gate cell portion (resist pattern forming step for forming source contact trench) in the manufacturing method of the semiconductor device according to the embodiment of the present invention.

FIG. 4 is a flow view for the device cross section of a trench gate cell portion in a manufacturing method of the semiconductor device according to the preferred embodiment of the present invention (resist pattern forming step for forming source contact trench). In this case, while description is to be made for an example of using an n type epitaxial wafer 1 in which an n type epitaxial layer (thickness of the epitaxial layer is, for example, about 4 μm) is formed to a 200 φn$^+$-type silicon single crystal wafer (silicon wafer) as a starting material wafer, the diameter of the wafer may be 300 φ or 450 φ, or other diameter. Further, the conduction type of the wafer may be a p type or the like. Furthermore, the type of the wafer is not restricted to the epitaxial wafer but may also be other semiconductor substrates or insulative substrates. Further, semiconductor wafers or substrates other than those of the silicon type may also be used.

As shown in FIG. 4, the semiconductor wafer 1 mainly comprises an n$^+$ silicon substrate portion 1s and an epitaxial layer 1e. In the epitaxial layer 1e, an n type drift region 2 which is an original n type epitaxial layer is present and a p type channel region (p type base region) 3, an n$^+$ source region 4, etc., are formed thereover. A plurality of trench gate electrodes (polysilicon electrodes) 6 are periodically provided such that the upper portions thereof protrude from the epitaxial layer 1e, and a gate insulator film 7 is disposed at the middle lower periphery of each of the trench gate electrodes 6. An interlayer insulator film 21 is formed to the semiconductor wafer 1 on the device surface side 1a and completely covers each of the trench gate electrodes 6. An example of the interlayer insulator film 21 includes a multi-layered insulator film comprising, for example, a silicon nitride film (silicon nitride insulator film) having a thickness of about 60 nm, a PSG film (silicon oxide insulator film) having a thickness of about 300 nm, and an SOG film (silicon oxide type insulator) having a thickness of about 95 nm.

Figure 5:
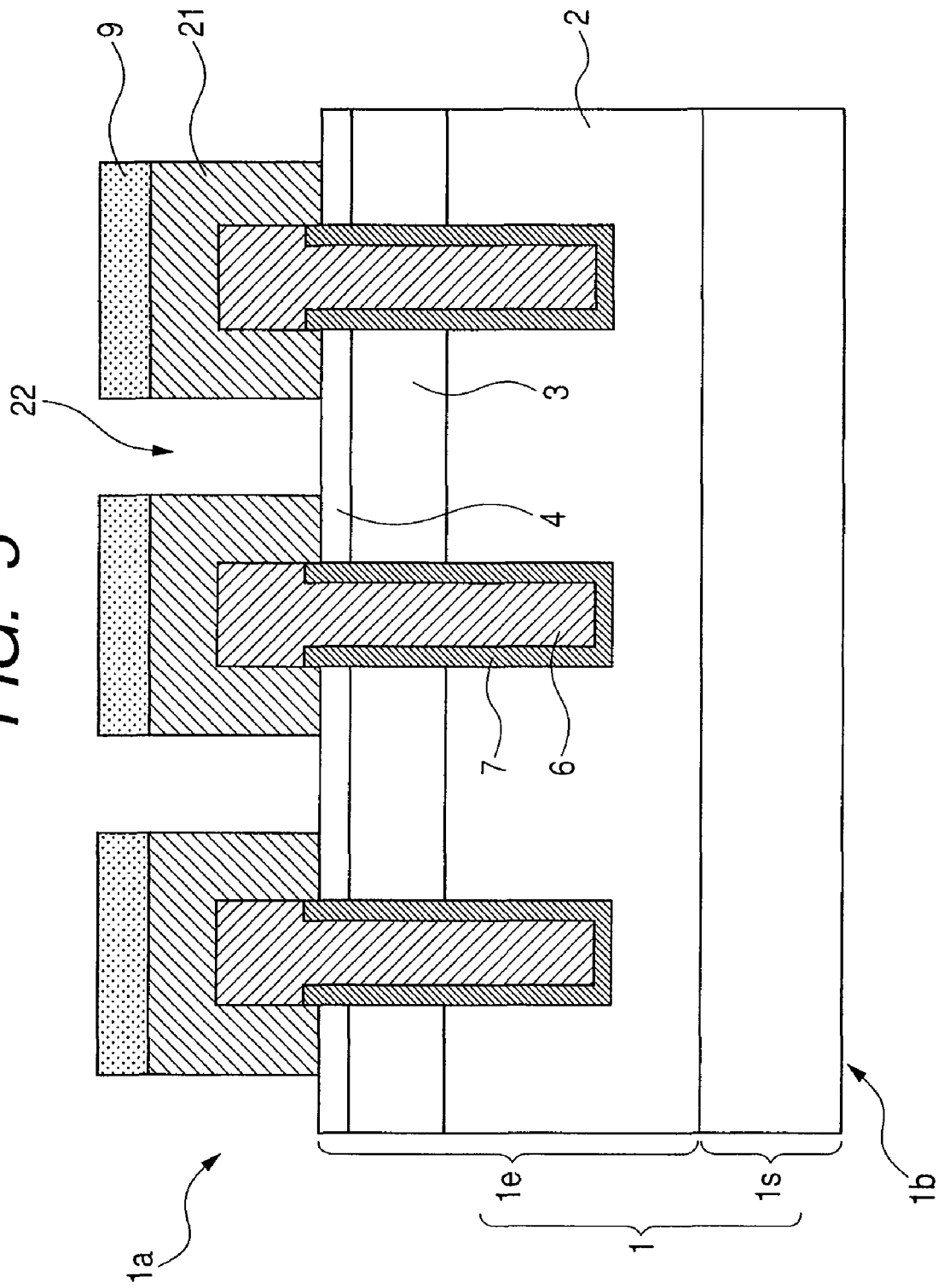
FIG. 5 is a flow view for the device cross section in the trench gate cell portion (source contact trench forming step) in the manufacturing method of the semiconductor device according to the embodiment of the present invention.
Figure 6:
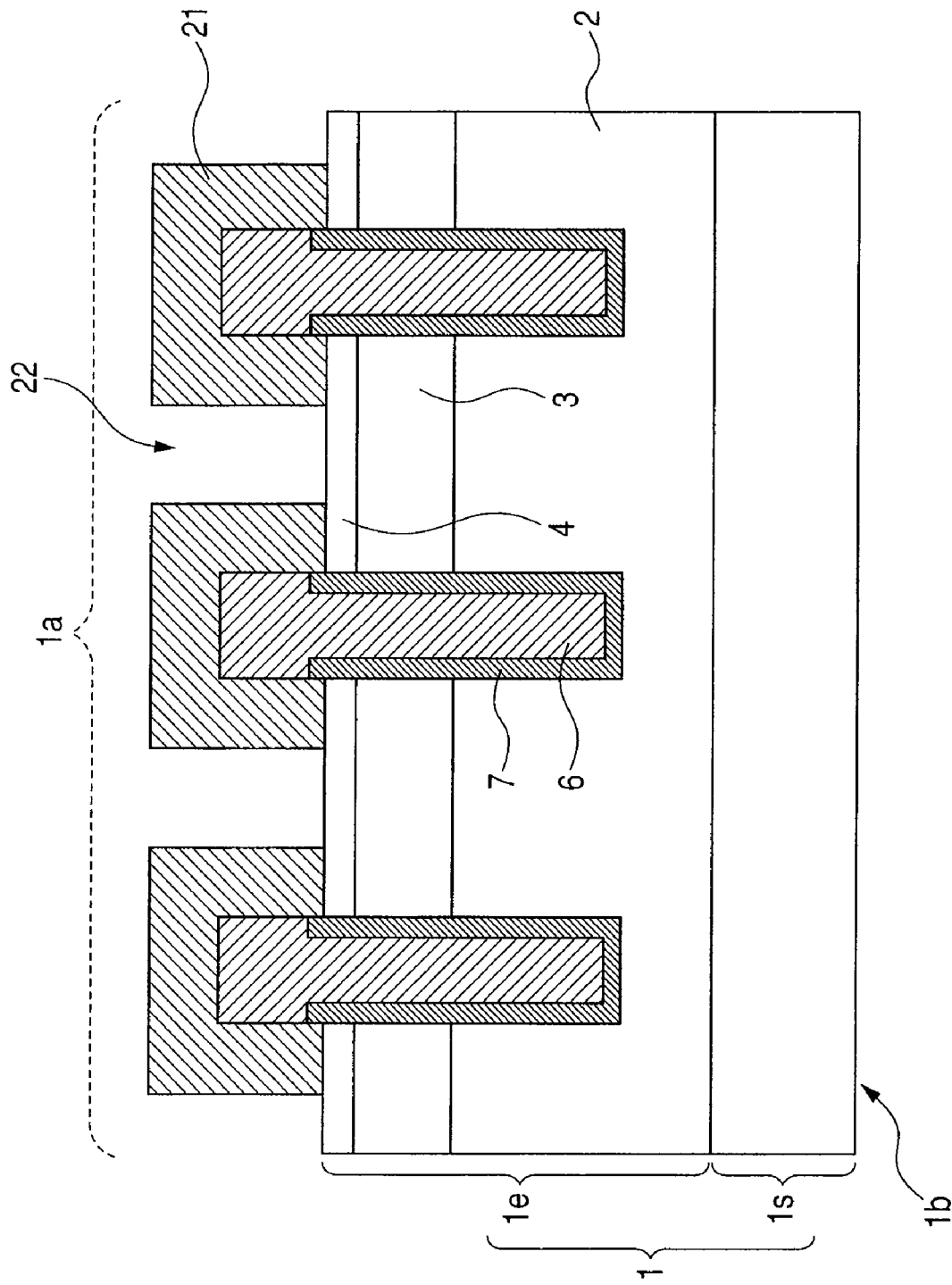
FIG. 6 is a flow view for the device cross section in the trench gate cell portion (resist pattern removing step for forming source contact trench) in the manufacturing method of the semiconductor device according to the embodiment of the present invention.

A resist film 9 used for fabrication is formed over the interlayer insulator film 21. When dry etching is conducted using the resist film 9 as an etching mask, a concave portion (source contact trench) 22 is formed as shown in FIG. 5. Then, when an unnecessary resist film 9 is removed, it is in a state as shown in FIG. 6.

Figure 7:
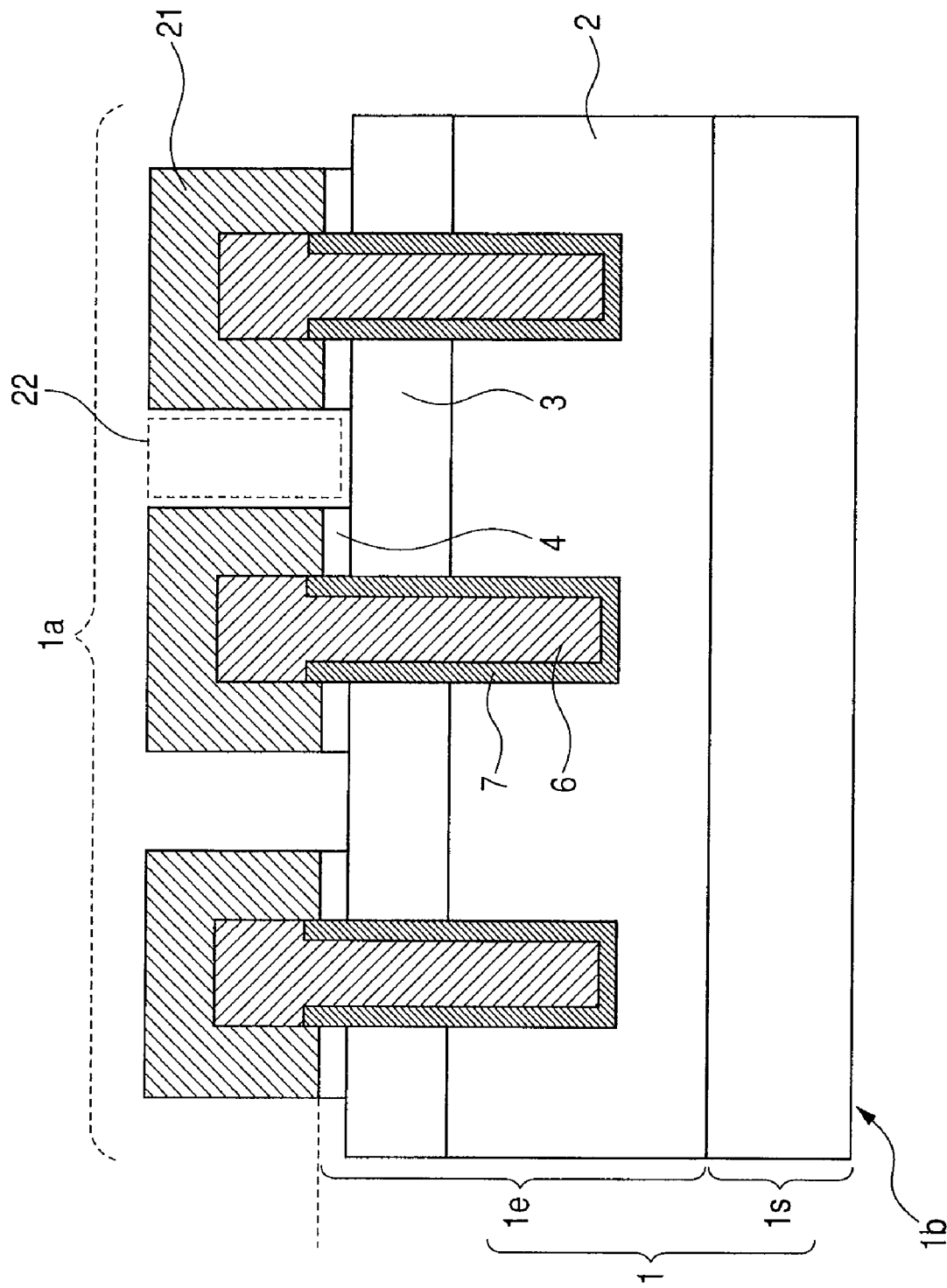
FIG. 7 is a flow view for the device cross section in the trench gate cell portion (source contact trench extending step) in the manufacturing method of the semiconductor device according to the embodiment of the present invention.

Then, when dry etching is further conducted by using the patterned interlayer insulator film 21 as a mask, the concave portion (source contact trench) 22 is extended as far as the upper end of the p type channel region 3 as shown in FIG. 7.

Figure 8:
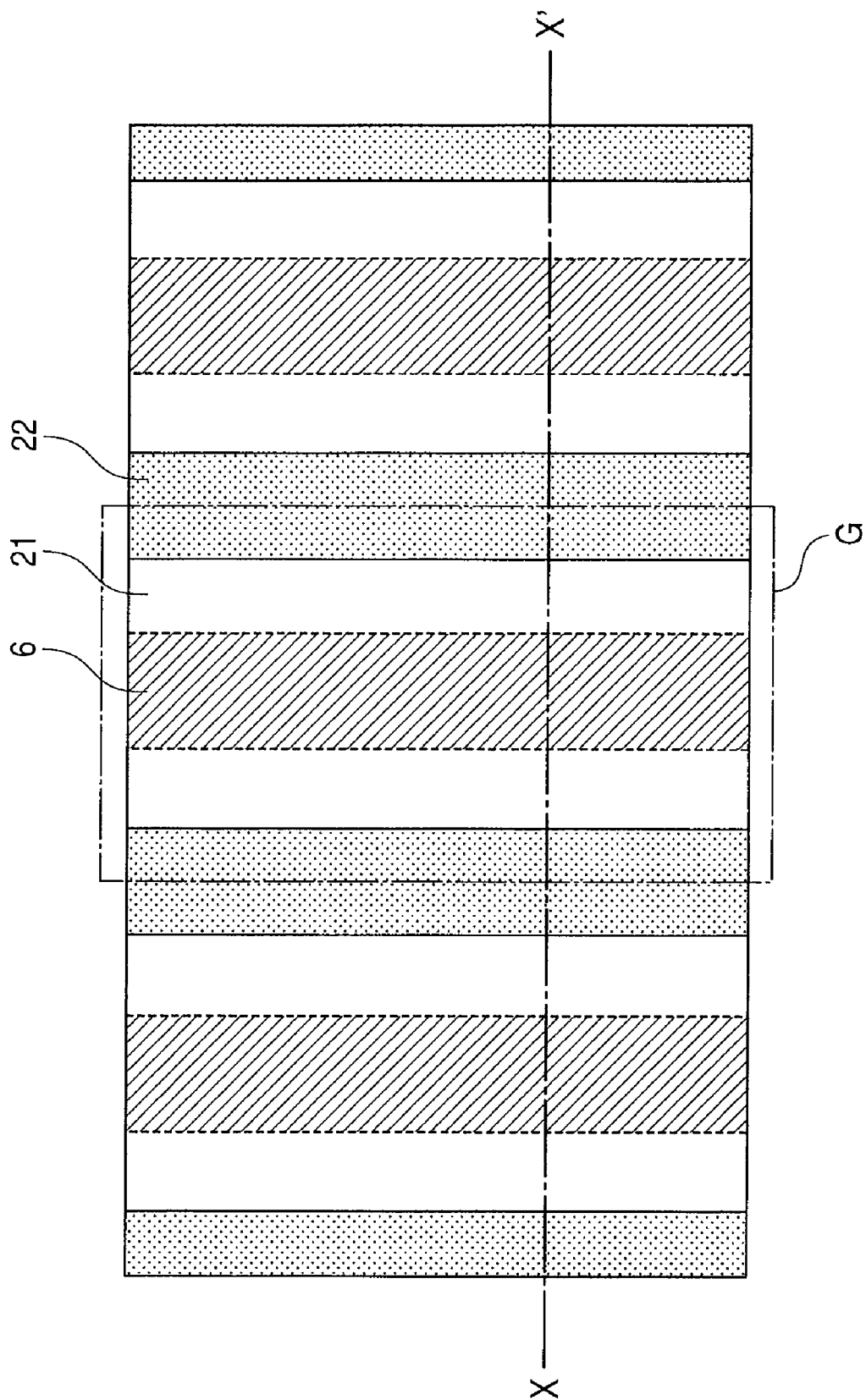
FIG. 8 is an upper plan view of the device in the trench gate cell portion (p+ body contact region introducing step) in the manufacturing method of the semiconductor device according to the embodiment of the present invention.

FIG. 8 shows an upper surface of the device (wafer upper surface) corresponding to FIG. 7 (also corresponding to FIG. 9) at this time. In FIG. 8, a cell repetitive unit region G is shown also corresponding to FIG. 9.

Figure 9:
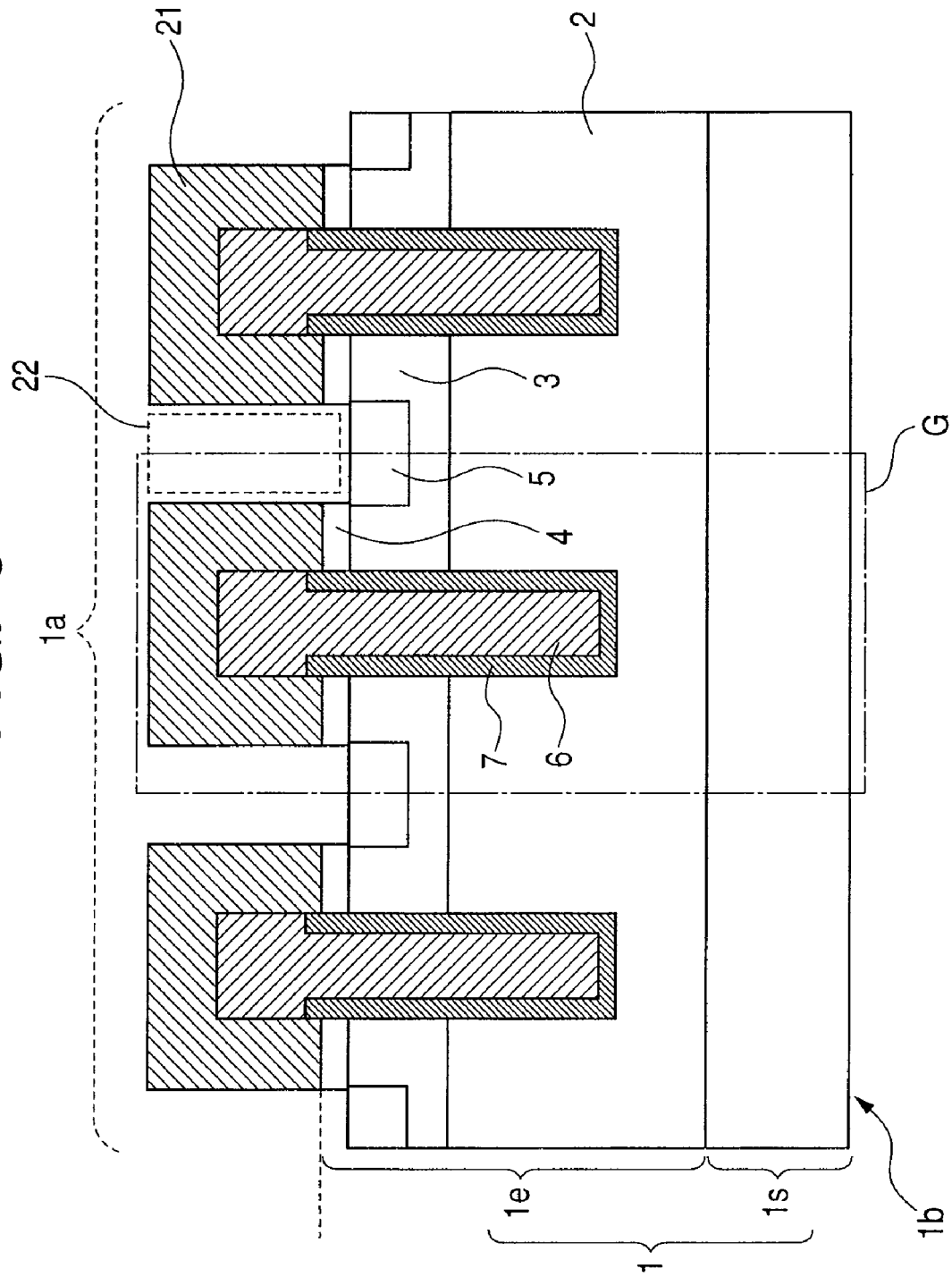
FIG. 9 is a flow view for the device cross section in the trench gate cell portion (corresponding to cross section X-X' in FIG. 8) in the manufacturing method of the semiconductor device according to the embodiment of the present invention.

Succeeding to FIG. 7, a p$^+$ body contact region 5 is introduced to the surface region of the p type channel region 3 by ion implantation through the source contact trench 22 (for example, the trench bottom width is about 300 nm, the trench depth is about 850 nm, and the aspect ratio is about 2 or more and 5 or less and about 2.8 in average) as shown in FIG. 9.

Figure 10:
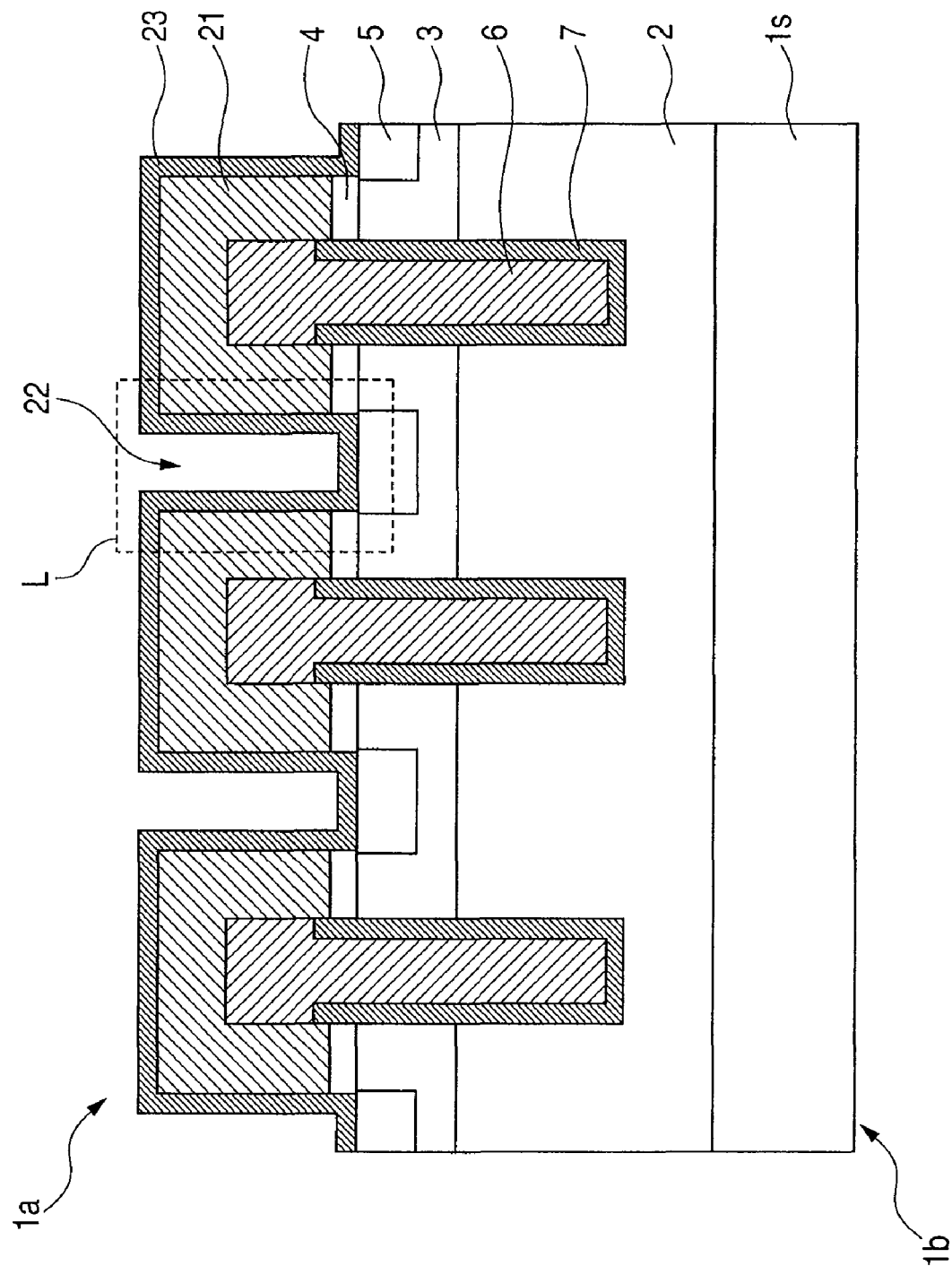
FIG. 10 is a flow view for the device cross section in the trench gate cell portion (barrier metal film deposition step) in the manufacturing method of the semiconductor device according to the embodiment of the present invention.

Then, as shown in FIG. 10, a barrier metal film 23 is formed substantially over the entire surface of the semiconductor wafer 1 on the device surface side 1a. Successively, silicidation annealing is conducted.

Figure 11:
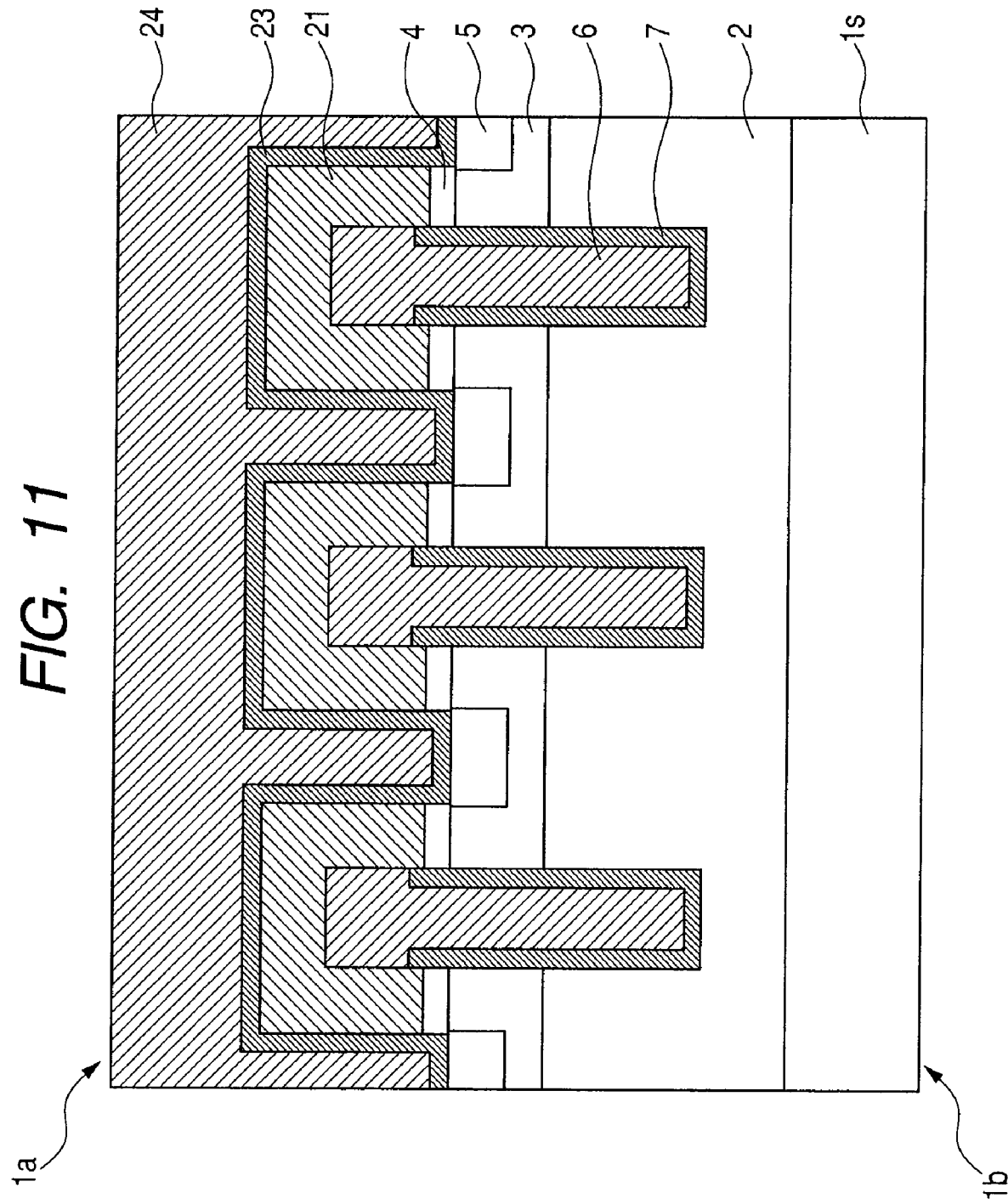
FIG. 11 is a flow view for the device cross section in the trench gate cell portion (aluminum type metal film deposition step) in the manufacturing method of the semiconductor device according to the embodiment of the present invention.

Then, as shown in FIG. 11, an aluminum type metal film 24 is formed as a source electrode substantially over the entire surface of the barrier metal film 23. As the source electrode material, AlCu, pure Al, copper type metal material, etc. can be used in addition to the silicon-added aluminum type metal (AlSi) explained herein.

Then, the aluminum type metal film 24 is patterned, over which a final passivation insulator film (organic insulator film such as one made of a coating type polyimide resin layer having a thickness, for example, of about 2 μm) is formed, and a necessary opening is formed. When this is diced into individual chips, a device as shown in FIG. 3 is obtained.

In the next section, details for the process from FIG. 10 to FIG. 11 are to be explained with reference to FIG. 12 to FIG. 14 which are enlarged cross-sectional views for a main portion corresponding to an enlarged portion L at the periphery of the concave portion in FIG. 10.

4. Explanation for the Process Flow for the Device Cross Section of a Main Part in the Manufacturing Method of the Semiconductor Device According to the Preferred Embodiment of the Present Invention (Mainly, with Reference to FIG. 12 to FIG. 14, and FIG. 1 and FIG. 2)

In the state of FIG. 9, a lower barrier metal film 23a (titanium film) is formed by sputtering film deposition substantially over the entire surface of the semiconductor wafer 1 on the side 1a of the device surface. In FIG. 12 to FIG. 14, interlayer insulator films, etc. at the periphery of the concave portion (source contact trench) 22 are collectively shown as a material 21p as the interlayer insulator films, etc. at the peripheries of the concave portions.

The sputtering film deposition of the titanium film 23a is conducted, for example, by the following procedures. That is, the wafer 1 is contained in the wafer transportation container (wafer cassette) 53 shown in FIG. 1 and set to the load port 52 of the multi-chamber type wafer processing apparatus 51. Then, the wafer 1 is at first set to the wafer stage in the degassing chamber (preheat processing chamber) 56 and a preheating treatment is conducted for removing the water content, etc. on the surface. Conditions for the preheat treatment include, for example, a temperature set for the stage of about 375° C., a pressure of about 266 pascals, an argon flow rate of about 200 sccm, and a processing time for about 50 sec.

Then, the wafer 1 is set to the wafer stage of the sputter etching chamber 57 in FIG. 1 and a sputtering etching treatment is conducted for removing the oxide film at the surface. Conditions for the sputtering etching treatment include, for example, temperature not controlled for the stage, a pressure of about 0.5 pascal, an argon flow rate of about 37.5 sccm, a plasma excitation method, for example, by CCP (Capacitively Coupled Plasma) method, a high frequency power of 400 W (for example, at 60 MHz), a processing time for about 25 sec and the etching amount of about 10 nm.

Then, the wafer is set to the wafer stage of the titanium sputtering chamber 58 shown in FIG. 1, and a titanium sputtering film deposition treatment is conducted, for example, by a PCM sputtering method. Conditions for the titanium sputtering film deposition treatment include, for example, a temperature set for the stage of about 355° C., a pressure of about 10 pascals, an argon flow rate of about 56 sccm, an upper electrode high frequency power of about 2.5 KW (for example, at 60 MHz), a processing time for about 6 sec, and an amount of film deposition of about 10 nm. The step can be conducted by the PCM system, as well as by another ionized sputtering method, or by usual sputtering film deposition which is not an ionized sputtering method.

Successively, an upper barrier metal film 23b (titanium nitride film) is formed substantially over the entire surface of the titanium film 23a by reactive sputtering film deposition. The reactive sputtering film deposition of the titanium nitride film 23b is conducted, for example, by the following procedures. That is, the wafer 1 is transported out of the titanium sputtering chamber 58 shown in FIG. 1 and set to the wafer stage of the titanium nitride reactive sputtering film deposition chamber 59, and the reactive sputtering film deposition treatment for the titanium nitride film 23b is conducted. Conditions for the reactive sputtering film deposition treatment are, for example, a temperature set for the stage of about 445° C., a pressure of about 0.5 pascal, an argon flow rate of about 56 sccm, a nitrogen flow rate of about 84 sccm, a DC current power for the upper electrode of about 9 KW, a processing time for about 35 sec, and an amount of film deposition of about 70 nm. The step can also be conducted by the PCM method.

As the upper barrier metal film 23b, TiW, TaN, etc. can be used in addition to titanium nitride.

Figure 12:
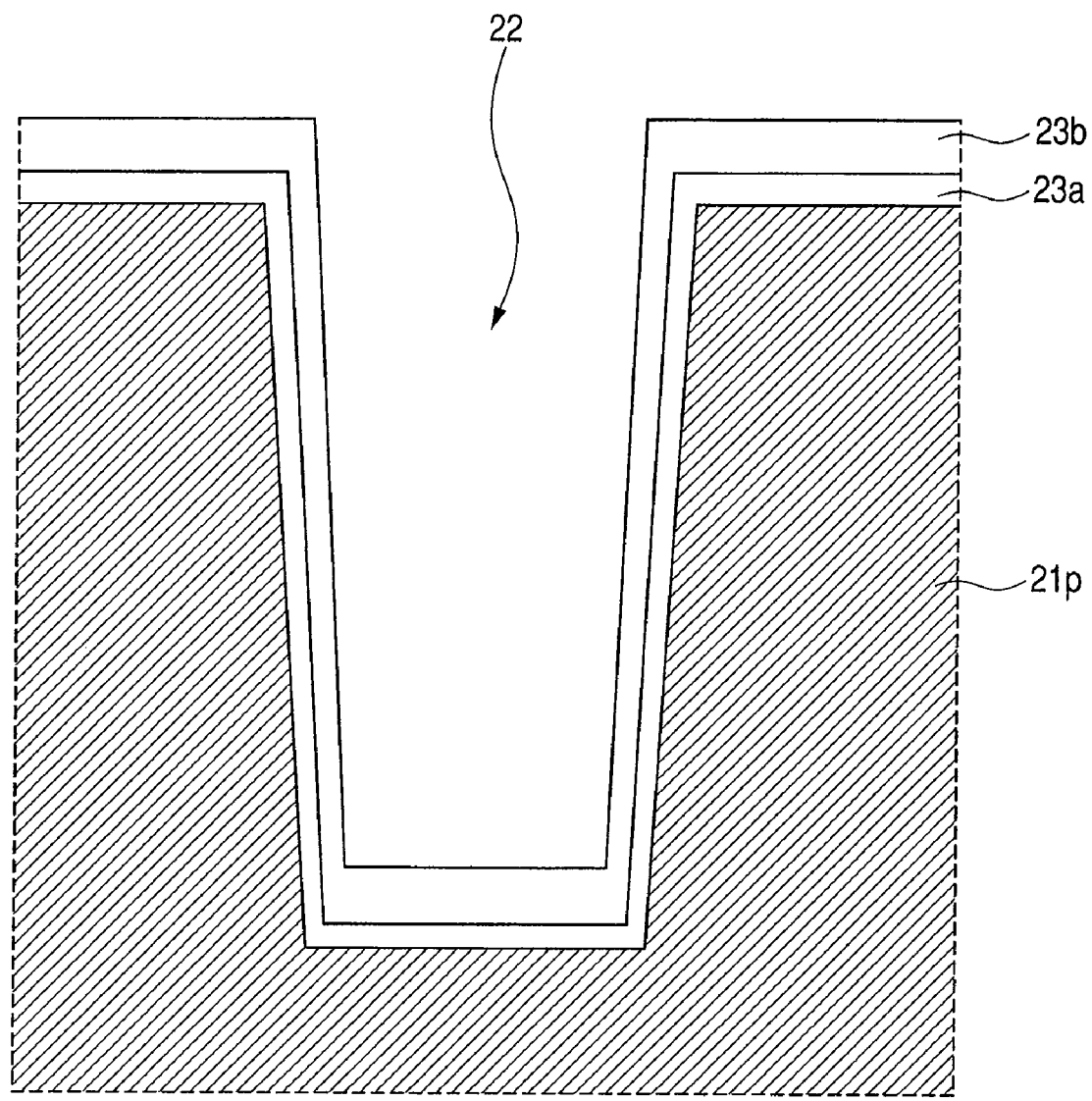
FIG. 12 is an enlarged cross-sectional view for the device corresponding to a portion shown at L in FIG. 10.

Then, when silicidation annealing is conducted, the portion of the titanium film 23a in contact with the silicon material is put to titanium silicidation over the entire thickness thereof in FIG. 12. Since the drawing would be made complicated, change thereof is not indicated in FIG. 12 to FIG. 14.

The silicidation annealing is conducted, for example, by the following procedures. That is, the wafer 1 is transported outside of the multi-chamber type wafer processing apparatus shown in FIG. 1. Then, it is contained in the wafer container 53 and transferred, for example, to a batch annealing apparatus, and a silicidation annealing treatment is conducted. Conditions for the silicidation annealing treatment are, for example, a temperature of about 650° C., an atmospheric pressure, for example, at a normal pressure, a nitrogen gas flow rate of about 15 L/min, and a processing time for about 10 min. The step can also be conducted in the multi-chamber type wafer processing apparatus 51 or by a sheet-by-sheet RTA apparatus disposed in another portion.

Figure 13:
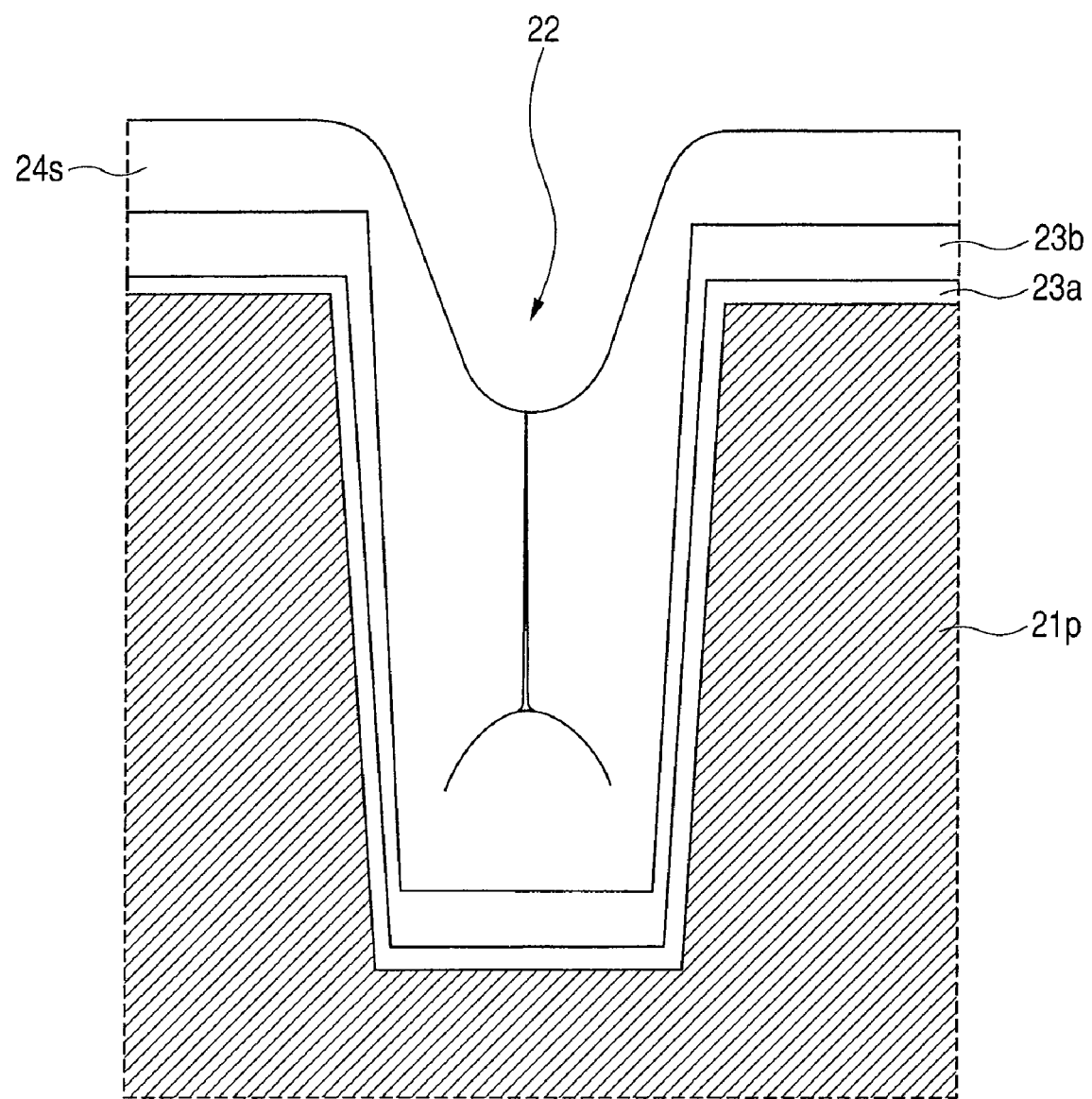
FIG. 13 is an enlarged device cross-sectional view showing the state in the course of an aluminum type metal film deposition step in FIG. 11 (seed layer formation completed) subsequent to FIG. 12.

When silicidation annealing is completed, a seed aluminum type metal film 24s is formed substantially over the entire surface of the titanium nitride film 23b by the PCM sputtering film deposition as shown in FIG. 13.

The sputtering film deposition for the seed aluminum type metal film 24s is conducted, for example, by the procedures as described below. That is, the wafer 1 is discharged from the batch annealing apparatus, contained in the wafer transportation container (wafer cassette) 53 in FIG. 1, and set to the load port 52 of the multi-chamber type wafer processing apparatus 51. Then, the wafer 1 is again set to the wafer stage in the degassing chamber 56, and a preheating treatment is conducted for removing water contents, etc. on the surface. Conditions for the preheating treatment include, for example, a temperature set for the stage of about 375° C., a pressure of about 266 pascals, an argon flow rate of about 200 sccm, and a processing time for about 50 sec.

Then, the wafer 1 is set to the wafer stage 62 in the aluminum type metal film sputtering chamber 61 shown in FIG. 1 and FIG. 2, and a sputtering film deposition treatment for the seed aluminum type metal film 24s is conducted. Conditions for the seed aluminum type metal film deposition treatment include, for example, a temperature set for the stage of about 420° C. (electrostatic chuck being turned off), a pressure of about 5 pascals, an argon flow rate of about 20 sccm, a high frequency power for the upper electrode of 4 KW (for example, at 60 MHz), a DC power for the upper electrode of about 1 KW, a high frequency power for the lower electrode of about 200 W (for example, at 13.56 MHz), a processing time for about 3 min, and an amount of film deposition of about 600 nm. Further, a preferred range of the temperature set for the stage is about from 400° C. to 440° C. By turning off the electrostatic chuck, it is possible to prevent closure in the upper portion of the source contact trench 22 during treatment for the seed aluminum type metal film deposition caused by excessive increase of the wafer temperature and excessive progress for the reflow of the deposited aluminum type metal material. That is, in the former-half process during formation of the aluminum type metal material film, deposition of the aluminum type metal material film having a sufficient thickness to the bottom of the source contact trench 22 contributes more to the final filing property than the planarization thereof by reflow. Accordingly, the bias power applied to the lower electrode is particularly effective in the former-half process in that the metal ions are applied more vertically to the wafer.

Figure 14:
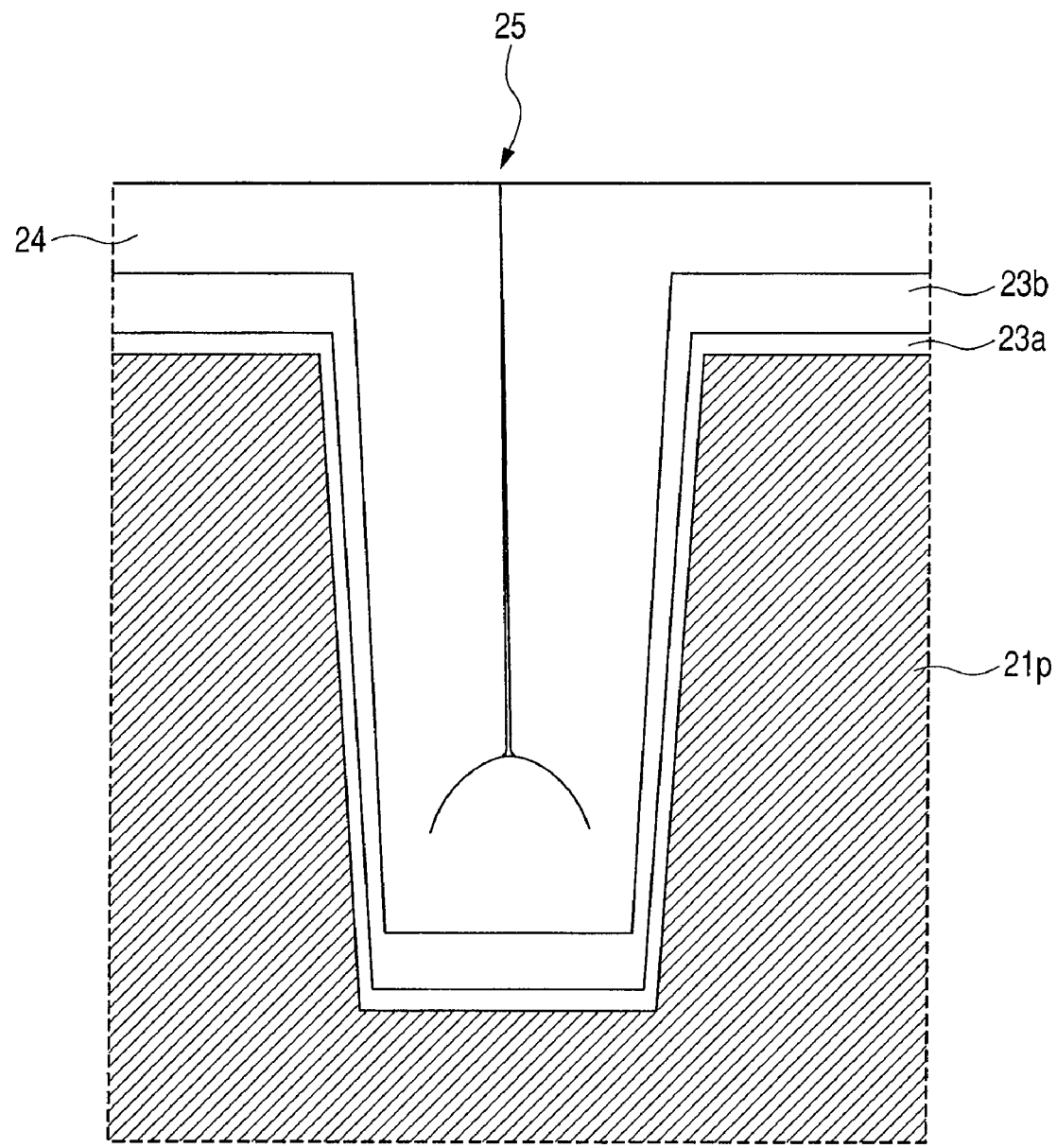
FIG. 14 is an enlarged cross-sectional view for the device showing the completed state of the aluminum type metal film deposition step in FIG. 11 (filling with aluminum type metal film completed) subsequent to FIG. 13.

Then, as shown in FIG. 14, an aluminum type metal film 24 is formed substantially over the entire surface of the seed aluminum type metal film 24s by the PCM sputtering film deposition so as to fill the inside of the concave portion (source contact trench) 22 and, further, cover the portion above the titanium nitride film 23b other than the concave portion (source contact trench) 22, being integrated with the seed aluminum type metal film 24s. That is, this treatment forms the aluminum type metal film 24 as a source electrode 24 (emitter electrode in the case of IGBT) along with a characteristic seam pattern 25.

The latter sputtering film deposition treatment for the aluminum type metal film 24 (latter-half process) is conducted, for example, by the following procedure. That is, the treatment is conducted while changing the condition continuously to the following treatment conditions in a state of setting the wafer 1 to the wafer stage 62 of the film deposition chamber 61 upon film deposition of the sheet aluminum type metal film 24s (while keeping other conditions substantially as they are). That is, conditions for the sputtering film deposition treatment for the aluminum type metal film 24 in the latter include, for example, a temperature set for the stage of about 420° C. (electrostatic chuck being turned on), a pressure of about 5 pascals, an argon flow rate of about 20 sccm, a frequency power for the upper electrode of 4 KW (for example, at 60 MHz), a DC power for the upper electrode of 1 KW, a high frequency power for the lower electrode being turned off, a processing time for about 3 min, and an amount of film deposition of about 600 nm. A suitable range of the temperature set for the stage of about from 400° C. to 440° C.

In a case where the temperature set for the stage in the sputtering film deposition treatment (former-half and latter-half processes) is lower than 400° C., reflow does not proceed sufficiently and, on the other hand, in a case where the temperature exceeds 440° C., undesired metal agglomeration tends to occur. Further, in the sputtering film deposition treatment (latter-half process), if the high frequency power for the lower electrode is kept on, similar agglomeration phenomenon tends to occur due to undesired increase in the wafer temperature.

5. Explanation for Data, Etc. Showing the Cross-Sectional Shape of the Power MOSFET Manufactured by the Manufacturing Method of the Semiconductor Device According to the Preferred Embodiment of the Present Invention (Mainly, with Reference to FIG. 15 and FIG. 16)

Figure 15:
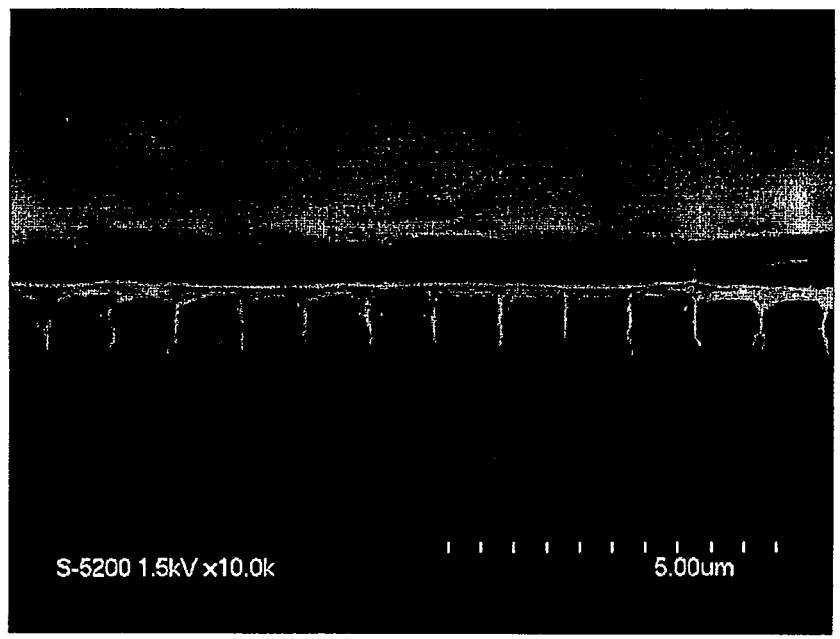
FIG. 15 shows an SEM (Scanning Electron Microscopy) photograph of the device cross section in a trench gate cell portion at the time the aluminum type metal film deposition step is completed in the manufacturing method of the semiconductor device of a embodiment of the present invention.
Figure 16:
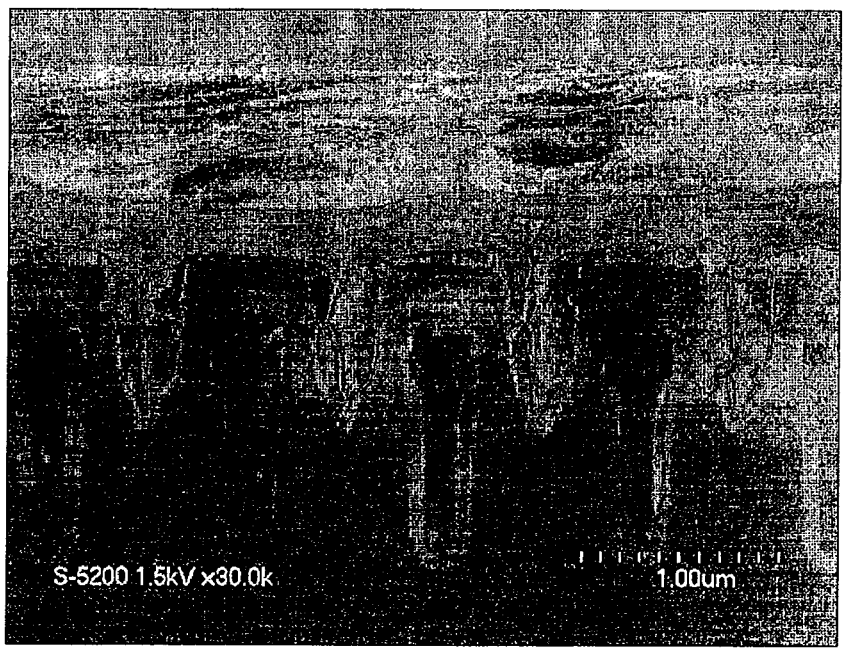
FIG. 16 is a fragmentary enlarged photograph of FIG. 15.

FIG. 15 and FIG. 16 show SEM photographs for the cross-sectional shape of the trench gate power MOSFET manufactured by the manufacturing method of the semiconductor device according to the preferred embodiment of the present invention that has been described above. FIG. 16 is a fragmentary enlarged view for FIG. 15. In the SEM photograph of FIG. 16, a white curve extending substantially horizontally slightly above the center is an upper end of the aluminum type metal film 24 (source electrode) of FIG. 11. It can be seen therefrom that even a trench of a high aspect ratio can be filled effectively without generation of voids by the method of the preferred embodiment described above.

6. Conclusion

While the invention made by the present inventors has been described based on the preferred embodiment specifically, it will be apparent that the invention is not limited thereto but may be modified variously within the scope the invention without departing from the gist thereof.

For example, while the embodiment has been described specifically to the power MOSFET as an example, it will be apparent that the present invention is not limited thereto but can be applied generally to other elemental devices such as IGBT, etc. and integrated circuit devices including them.

Further, in the embodiment described above, while descriptions have been made specifically to an N channel type device such as an N channel type power MOSFET, it will be apparent that the present invention is not limited thereto and the invention is applicable also to P channel type devices such as a P channel type power MOSFET. This can be attained by PN reversal of reversing P and N conduction types for all of the components in the embodiment described above.

Further, in the foregoing embodiment, while the descriptions have been made mainly for the sputtering film deposition method as the method of forming the metal material film, it will be apparent that the present invention is not limited thereto but that a CVD method, a plating method, etc. can be applied optionally.

What is claimed is:
1. A manufacturing method of a semiconductor device comprising the steps of:
(a) forming downward a concave portion from an upper surface of a first insulator film over a first main surface of a semiconductor wafer;
(b) forming a barrier metal film to an inner surface of the concave portion and the upper surface of the first insulator film; and
(c) after the step (b), forming an aluminum-type metal layer so as to fill the inside of the concave portion and cover the upper surface of the first insulator film in a sputter processing chamber by ionized sputtering;
wherein the step (c) is conducted in a state of directing upward the first main surface of the semiconductor wafer to a wafer stage having an electrostatic chuck disposed in the sputter processing chamber,
wherein the step (c) includes the sub-steps of:
(c1) forming a seed aluminum-type metal layer so as to cover the barrier metal film at the inner surface of the concave portion and at the upper surface of the first insulator film; and
(c2) continuing the ionized sputtering thereby forming the aluminum-type metal layer to fill the inside of the concave portion and cover the upper surface of the first insulator film, and being integrated with the seed aluminum-type metal layer, and
wherein the electrostatic chuck is in an off state in the sub-step (c1) and the electrostatic chuck is in an on state in the sub-step (c2),
wherein a bias is applied by a second high frequency power for the electrode on the side of the wafer stage in the sub-step (c1), and
wherein a bias is not applied for the electrode on the side of the wafer stage in the sub-step (c2).

2. The manufacturing method of a semiconductor device according to claim 1, wherein the temperature of the wafer stage is 400° C. or higher and lower than 440° C.

3. The manufacturing method of a semiconductor device according to claim 1, wherein the sputter processing chamber is a magnetron type.

4. The manufacturing method of a semiconductor device according to claim 1, wherein a first high frequency power and a DC bias are applied on the side of the target in the step (c).

5. The manufacturing method of a semiconductor device according to claim 1, wherein the semiconductor device has a power MOSFET or IGBT.

6. The manufacturing method of a semiconductor device according to claim 5, wherein the aluminum-type metal layer is the source electrode of the power MOSFET or the emitter electrode of the IGBT.

7. The manufacturing method of a semiconductor device according to claim 1, wherein the aspect ratio of the concave portion is 2 or more.

8. The manufacturing method of a semiconductor device according to claim 1, wherein the concave portion reaches as far as the inside of a bulk portion of the semiconductor wafer.

* * * * *